United States Patent
Torimi et al.

(10) Patent No.: US 9,447,517 B2
(45) Date of Patent: Sep. 20, 2016

(54) SEED MATERIAL FOR LIQUID PHASE EPITAXIAL GROWTH OF MONOCRYSTALLINE SILICON CARBIDE, AND METHOD FOR LIQUID PHASE EPITAXIAL GROWTH OF MONOCRYSTALLINE SILICON

(75) Inventors: Satoshi Torimi, Kanonji (JP); Satoru Nogami, Kanonji (JP); Tsuyoshi Matsumoto, Kanonji (JP)

(73) Assignee: TOYO TANSO CO., LTD., Osaka (JP)

( * ) Notice: Subject to any disclaimer, the term of this patent is extended or adjusted under 35 U.S.C. 154(b) by 354 days.

(21) Appl. No.: 13/996,071

(22) PCT Filed: Jun. 29, 2011

(86) PCT No.: PCT/JP2011/064878
§ 371 (c)(1),
(2), (4) Date: Jun. 20, 2013

(87) PCT Pub. No.: WO2012/086240
PCT Pub. Date: Jun. 28, 2012

(65) Prior Publication Data
US 2013/0263774 A1    Oct. 10, 2013

(30) Foreign Application Priority Data
Dec. 24, 2010    (JP) .................. 2010-288476

(51) Int. Cl.
*C30B 19/12* (2006.01)
*C30B 29/36* (2006.01)
*C30B 28/12* (2006.01)

(52) U.S. Cl.
CPC ............... *C30B 19/12* (2013.01); *C30B 28/12* (2013.01); *C30B 29/36* (2013.01); *Y10T 428/26* (2015.01)

(58) Field of Classification Search
CPC ....... C30B 19/00; C30B 19/08; C30B 19/10; C30B 19/12; C30B 28/00; C30B 28/04; C30B 29/00; C30B 29/36
USPC ................ 117/11, 54, 58, 63, 902, 937, 951
See application file for complete search history.

(56) References Cited

U.S. PATENT DOCUMENTS 4,582,561 A * 4/1986 Ioku ................... C30B 11/00
117/56
5,879,450 A    3/1999 Lee et al.
(Continued)

FOREIGN PATENT DOCUMENTS

JP    55-144499 A    11/1980
JP    04-055397 A    2/1992
(Continued)

OTHER PUBLICATIONS

Rohmfeld, et al. publication entitled "Influence of stacking disorder on the Raman spectrum of 3C-SiC," Phys. Stat. Sol. (b), vol. 215, pp. 115-119 (1999).*
(Continued)

*Primary Examiner* — Kenneth A Bratland, Jr.
(74) *Attorney, Agent, or Firm* — Keating and Bennett, LLP (57) ABSTRACT

Provided is an inexpensive seed material for liquid phase epitaxial growth of silicon carbide. A seed material 12 for liquid phase epitaxial growth of a monocrystalline silicon carbide includes a surface layer containing a polycrystalline silicon carbide with a 3C crystal polymorph. Upon Raman spectroscopic analysis of the surface layer with an excitation wavelength of 532 nm, a peak other than a TO peak and an LO peak is observed as a peak derived from the polycrystalline silicon carbide with a 3C crystal polymorph.

12 Claims, 5 Drawing Sheets

(56) References Cited

U.S. PATENT DOCUMENTS

| | | | |
|---|---|---|---|
| 6,214,108 B1 | 4/2001 | Okamoto et al. | |
| 6,936,102 B1* | 8/2005 | Otsuki | C23C 16/325 117/101 |
| 2006/0249073 A1* | 11/2006 | Asaoka | C30B 19/00 117/84 |

FOREIGN PATENT DOCUMENTS

| | | |
|---|---|---|
| JP | 2000-044398 A | 2/2000 |
| JP | 2005-097040 A | 4/2005 |
| JP | 2008-037684 A | 2/2008 |
| JP | 2008-230946 A | 10/2008 |

OTHER PUBLICATIONS

Official Communication issued in corresponding European Application 11851187.2, mailed on Jun. 3, 2014.

Rohmfeld, et al., "Influence of Stacking Disorder on the Raman Spectrum of 3C-SiC", Physica Status Solidi (B), vol. 215, No. 1, Sep. 1, 1999, pp. 115-119.

Chinone, et al., "Applications of High Purity SiC Prepared by Chemical Vapor Deposition", Springer Proceedings in Physics, vol. 43, Jan. 1, 1989, pp. 198-206.

Hernandez, et al., "Study of Surface Defects on 3C-SiC Films Grown on Si(111) by CVD", Journal of Crystal Growth, vol. 253, No. 1-4, Jun. 1, 2003, pp. 95-101.

Official Communication issued in International Patent Application No. PCT/JP2011/064878, mailed on Aug. 16, 2011. X.

Nishitani et al., "Metastable solvent epitaxy of SiC", Journal of Crystal Growth, vol. 310, Jul. 2008, pp. 1815-1818.

Jeong et al., "Raman scattering studies of polycrystalline 3C-SiC deposited on $SiO_2$ and AlN thin films", Physica B, vol. 404, 2009, pp. 7-10.

English translation of Official Communication issued in corresponding International Application PCT/JP2011/064878, mailed on Jul. 11, 2013.

Official Communication issued in corresponding European Patent Application No. 11 851 187.2, mailed on May 31, 2016.

\* cited by examiner

SEED MATERIAL FOR LIQUID PHASE EPITAXIAL GROWTH OF MONOCRYSTALLINE SILICON CARBIDE, AND METHOD FOR LIQUID PHASE EPITAXIAL GROWTH OF MONOCRYSTALLINE SILICON

TECHNICAL FIELD

This invention relates to a seed material for liquid phase epitaxial growth of a monocrystalline silicon carbide and a method for liquid phase epitaxial growth of a monocrystalline silicon carbide using the same.

BACKGROUND ART

Silicon carbide (SiC) is considered to be capable of achieving high-temperature resistance, high voltage resistance, high-frequency resistance, and high environment resistance each of which could not be achieved by conventional semiconductor materials, such as silicon (Si) and gallium arsenide (GaAs). Therefore, silicon carbide is expected as a semiconductor material for next-generation power devices and a semiconductor material for high-frequency devices.

The seeded sublimation growth method (modified Lely method) is conventionally proposed as a method for growing a monocrystalline silicon carbide, such as for example in Patent Literature 1 below. In this modified Lely method, a seed material made of a monocrystalline silicon carbide is placed in a low-temperature zone of a crucible and a powder of source material containing Si as a source material is placed in a high-temperature zone thereof. Then, the interior of the crucible is brought into an inert atmosphere and heated to a high temperature of 1450° C. to 2400° C. to sublimate the powder of source material placed in the high-temperature zone. As a result, silicon carbide can be epitaxially grown on the surface of the seed material placed in the low-temperature zone.

Nevertheless, the modified Lely method is a method of growing silicon carbide crystals by providing a temperature gradient in the vapor phase. Therefore, in the case of using the modified Lely method, a large apparatus is required for epitaxial growth of silicon carbide and the process for epitaxial growth of silicon carbide is difficult to control. This presents a problem of rise in cost of producing a silicon carbide epitaxial growth film. In addition, epitaxial growth of silicon carbide in the vapor phase is nonequilibrium. Therefore, crystal defects are likely to occur in the silicon carbide epitaxial growth film being formed and there also arises a problem of ease of roughening of the crystal structure.

An example of a method for epitaxial growth of silicon carbide other than the modified Lely method is metastable solvent epitaxy (MSE) which is a method of epitaxially growing silicon carbide in the liquid phase, as proposed for example in Patent Literature 2.

In MSE, a seed material made of a crystalline silicon carbide, such as a monocrystalline silicon carbide or a polycrystalline silicon carbide, and a feed material made of silicon carbide are faced each other at a distance as small as, for example, 100 μm or less and a Si melt layer is interposed between them. Then, these materials are subjected to heating treatment in a vacuum, high-temperature environment to epitaxially grow silicon carbide on the surface of the seed material.

It is considered that in MSE a difference in chemical potential between the seed material and the feed material causes a concentration gradient of carbon dissolved in the Si melt layer and thus a silicon carbide epitaxial growth film is formed. Therefore, unlike the case of using the modified Lely method, there is not necessarily a need to provide a temperature difference between the seed material and the feed material. Hence, with the use of MSE, not only the process for epitaxial growth of silicon carbide can be easily controlled with a simple apparatus but also a high-quality silicon carbide epitaxial growth film can be stably formed.

In addition, MSE also has the advantage of being capable of forming a silicon carbide epitaxial growth film even on a large-area seed substrate and the advantage of lowering the temperature for the process of epitaxially growing silicon carbide because the extremely small thickness of the Si melt layer facilitates the diffusion of carbon from the feed material.

Accordingly, MSE is considered to be an extremely useful method as the method for epitaxial growth of a monocrystalline silicon carbide and active research on MSE has been carried out.

CITATION LIST

Patent Literature

Patent Literature 1: JP-A-2005-97040
Patent Literature 2: JP-A-2008-230946

SUMMARY OF INVENTION

Technical Problem

As described above, it is considered that in MSE the feed material and the seed material should be selected so that the feed material has a higher free energy than the seed material. Therefore, for example, Patent Literature 2 above describes that a feed substrate and a seed substrate are made different from each other in free energy by making the feed substrate and the seed substrate different in crystal polymorph. More specifically, the literature describes that if the feed substrate is formed of a polycrystalline 3C—SiC substrate, the seed substrate is formed such as of a monocrystalline 4H—SiC substrate having a lower free energy than the 3C—SiC substrate.

In this relation, a polycrystalline 3C—SiC substrate can be easily produced by CVD. Therefore, as described in Patent Literature 2, the use of a 3C—SiC substrate as the feed substrate enables a low cost of formation of a silicon carbide epitaxial growth film.

However, among silicon carbide substrates including a 4H—SiC substrate and a 3C—SiC substrate, the 3C—SiC substrate has the highest free energy. Therefore, it has been considered that the 3C—SiC substrate cannot be used as the seed substrate required to have low free energy. For this reason, in Patent Literature 2, the monocrystalline 4H—SiC substrate, which is difficult and expensive to produce, is used as the seed substrate. This presents a problem of rise in cost of forming a silicon carbide epitaxial growth film.

The present invention has been made in view of the foregoing points and an object thereof is to provide an inexpensive seed material for liquid phase epitaxial growth of silicon carbide.

Solution to Problem

The inventors have found through intensive studies that, among polycrystalline silicon carbide materials with a 3C crystal polymorph, there are materials likely to be eluted into a silicon melt layer and materials less likely to be eluted into a silicon melt layer and that the materials less likely to be eluted into a silicon melt layer can be suitably used as the seed material for liquid phase epitaxial growth of a monocrystalline silicon carbide. As a result, the inventors have led to the accomplishment of the invention.

Specifically, a seed material for liquid phase epitaxial growth of a monocrystalline silicon carbide according to the present invention is a seed material used in a method for liquid phase epitaxial growth of a monocrystalline silicon carbide. The seed material for liquid phase epitaxial growth of a monocrystalline silicon carbide according to the present invention includes a surface layer containing a polycrystalline silicon carbide with a 3C crystal polymorph. Upon Raman spectroscopic analysis of the surface layer with an excitation wavelength of 532 nm, a peak other than a TO peak and an LO peak is observed as a peak derived from the polycrystalline silicon carbide with a 3C crystal polymorph. The peak other than the TO peak and the LO peak is preferably observed at a lower wavenumber than that of the TO peak.

In the present invention, the seed material is such that upon Raman spectroscopic analysis of the surface layer thereof with an excitation wavelength of 532 nm, a peak other than a TO peak and an LO peak is observed as a peak derived from a polycrystalline silicon carbide with a 3C crystal polymorph. Therefore, the surface layer of the seed material for liquid phase epitaxial growth of a monocrystalline silicon carbide according to the present invention is less likely to cause elution into a silicon melt layer. Thus, with the use of the seed material for liquid phase epitaxial growth of a monocrystalline silicon carbide according to the present invention, a concentration gradient in the silicon melt layer can be suitably formed, so that liquid phase epitaxial growth of silicon carbide can be suitably performed.

Furthermore, the surface layer of the seed material for liquid phase epitaxial growth of a monocrystalline silicon carbide according to the present invention contains a polycrystalline silicon carbide with a 3C crystal polymorph. Therefore, unlike the case where the surface layer contains a polycrystalline silicon carbide with a 4H or 6H crystal polymorph and the case where the surface layer is made of a monocrystalline silicon carbide, the surface layer can be formed with ease at low cost by CVD (chemical vapor deposition).

Hence, with the use of the seed material for liquid phase epitaxial growth of a monocrystalline silicon carbide according to the present invention, an epitaxial growth film of a monocrystalline silicon carbide can be formed with ease at low cost.

Furthermore, in the present invention, since a peak other than a TO peak and an LO peak is observed as a peak derived from a polycrystalline silicon carbide with a 3C crystal polymorph upon Raman spectroscopic analysis of the surface layer of the seed material with an excitation wavelength of 532 nm, a hexagonal monocrystalline silicon carbide epitaxial growth film can be suitably formed.

In this relation, the peak derived from a polycrystalline silicon carbide with a 3C crystal polymorph and other than a TO peak and an LO peak can be considered as a peak derived from structural defects of 3C (the cubic crystal). Therefore, if a peak other than a TO peak and an LO peak is observed as a peak derived from a polycrystalline silicon carbide with a 3C crystal polymorph, the 3C crystal structure can be considered to have structural defects.

For example, if the 3C crystal structure has no structural defect, it can be considered that when a monocrystalline silicon carbide is epitaxially grown on the surface layer of the seed material, the crystal structure of the surface layer of the seed material is highly likely to be introduced into the monocrystalline silicon carbide, which makes it likely that a monocrystalline silicon carbide epitaxial growth film with a 3C crystal structure is formed.

In contrast, if the 3C crystal structure has structural defects, it can be considered that the seed material generates a portion of the surface layer having a crystal structure similar to a hexagonal crystal and the portion nucleates epitaxial growth, so that a monocrystalline silicon carbide epitaxial growth film with a hexagonal crystal structure is suitably formed.

In view of this, the higher the peak intensity of the peak derived from a polycrystalline silicon carbide with a 3C crystal polymorph and other than a TO peak and an LO peak, the better. Specifically, the peak derived from a polycrystalline silicon carbide with a 3C crystal polymorph and other than a TO peak and an LO peak preferably has a peak intensity 0.3 or greater times the peak intensity of the TO peak.

The term "method for liquid phase epitaxial growth" in the present invention refers to a method in which the seed material and a feed material are heated in a position facing each other with a silicon melt layer therebetween to form a concentration gradient of graphite melting in the silicon melt layer and a monocrystalline silicon carbide is epitaxially grown on the seed material using the concentration gradient.

The term "LO peak derived from a polycrystalline silicon carbide" in the present invention refers to a peak which is derived from the longitudinal optical mode among optical modes of oscillation between the two atoms of Si—C in the silicon carbide crystal and generally, in the case of a 3C polymorph, appears at 972 $cm^{-1}$.

On the other hand, the term "TO peak derived from a polycrystalline silicon carbide" refers to a peak which is derived from the transverse optical mode among optical modes of oscillation between the two atoms of Si—C in the silicon carbide crystal and generally, in the case of a 3C polymorph, appears at 796 $cm^{-1}$.

The term "feed material" in the present invention refers to a material capable of feeding ingredients for epitaxial growth of a monocrystalline silicon carbide, such for example as Si, C, and SiC. On the other hand, the term "seed material" refers to a material on the surface of which a monocrystalline silicon carbide can grow.

In the present invention, preferably, the absolute amount of shift of the LO peak from 972 $cm^{-1}$ is 4 $cm^{-1}$ or more, and more preferably, the amount of shift of the LO peak from 972 $cm^{-1}$ is 4 $cm^{-1}$ or more. In this case, the rate of epitaxial growth of the monocrystalline silicon carbide can be further increased. The reason for this can be that when the absolute amount of shift of the LO peak from 972 $cm^{-1}$ is 4 $cm^{-1}$ or more, the internal stress of the surface layer of the seed material is increased to increase the denseness of the surface layer, which makes the surface layer less likely to cause the elution into the silicon melt layer.

In the present invention, the full width at half-maximum of the LO peak is preferably 15 $cm^{-1}$ or less. With the use of the seed material having this structure, the rate of epitaxial growth of the monocrystalline silicon carbide can be still further increased.

The reason why the rate of epitaxial growth of the monocrystalline silicon carbide can be further increased when the full width at half-maximum of the LO peak is 15 cm$^{-1}$ or less can be that smaller full widths at half-maximum of the LO peak can be caused by higher degrees of crystallinity or lower impurity concentrations of the polycrystalline silicon carbide in the surface layer, which makes it still less likely to cause the elution from the surface layer.

In the present invention, the surface layer preferably contains a polycrystalline silicon carbide with a 3C crystal polymorph as a major ingredient and is preferably substantially made of the polycrystalline silicon carbide with a 3C crystal polymorph. With this structure, the rate of epitaxial growth of the monocrystalline silicon carbide can be still more effectively increased.

The term "major ingredient" in the present invention refers to an ingredient which is contained in a proportion of 50% by mass or more in the surface layer.

The expression "substantially made of the polycrystalline silicon carbide with a 3C crystal polymorph" means that the surface layer contains no ingredient other than the polycrystalline silicon carbide with a 3C crystal polymorph, except for impurities. The content of impurities in the surface layer when "substantially made of the polycrystalline silicon carbide with a 3C crystal polymorph" is generally 5% by mass or less.

The seed material for liquid phase epitaxial growth of a monocrystalline silicon carbide according to the present invention may include a support member and a polycrystalline silicon carbide film formed on the support member and forming the surface layer. In this case, the polycrystalline silicon carbide film preferably has a thickness within a range of 30 μm to 800 μm.

The seed material for liquid phase epitaxial growth of a monocrystalline silicon carbide according to the present invention may be formed of a polycrystalline silicon carbide material, such as a polycrystalline silicon carbide substrate containing a polycrystalline silicon carbide with a 3C crystal polymorph.

In a method for liquid phase epitaxial growth of a monocrystalline silicon carbide according to the present invention, the seed material for liquid phase epitaxial growth of a monocrystalline silicon carbide according to the present invention and a feed material including a surface layer containing a polycrystalline silicon carbide with a 3C crystal polymorph are heated with the surface layers of the seed material and the feed material facing each other through a silicon melt layer to epitaxially grow a monocrystalline silicon carbide on the surface layer of the seed material.

With the method for liquid phase epitaxial growth of a monocrystalline silicon carbide according to the present invention, an epitaxial growth film of the monocrystalline silicon carbide can be formed at low cost. In addition, there is not necessarily a need to provide a temperature difference between the seed material and the feed material. Therefore, not only the process for epitaxial growth of a monocrystalline silicon carbide can be easily controlled with a simple apparatus but also a high-quality monocrystalline silicon carbide epitaxial growth film can be stably formed.

Furthermore, with the method for liquid phase epitaxial growth of a monocrystalline silicon carbide according to the present invention, an epitaxial growth film of a hexagonal monocrystalline silicon can be suitably formed.

Advantageous Effects of Invention

The present invention can provide an inexpensive seed material for liquid phase epitaxial growth of silicon carbide.

DESCRIPTION OF EMBODIMENTS

A description will be given below of an example of a preferred embodiment for working of the present invention. However, the following embodiment is simply illustrative. The present invention is not at all limited by the following embodiment.

Figure 1:
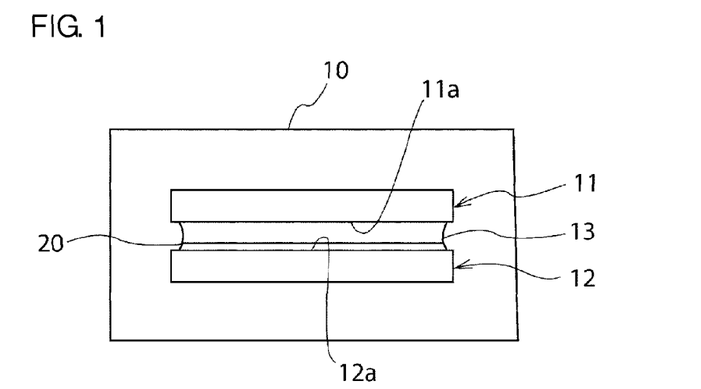
FIG. 1 is a schematic view for illustrating a method for epitaxial growth of a monocrystalline silicon carbide in one embodiment of the present invention.

FIG. 1 is a schematic view for illustrating a method for epitaxial growth of a monocrystalline silicon carbide in this embodiment.

The embodiment describes an example in which an epitaxial growth film of a monocrystalline silicon carbide is formed using MSE.

In this embodiment, as shown in FIG. 1, a seed substrate 12 as the seed material and a feed substrate 11 as the feed material are arranged in a vessel 10 so that a principal surface 12a of the seed substrate 12 and a principal surface 11a of the feed substrate 11 face each other with a silicon plate therebetween. In this position, the seed substrate 12 and the feed substrate 11 are heated to melt the silicon plate. Thus, the seed substrate 12 and the feed substrate 11 are faced each other with a silicon melt layer 13 therebetween. By keeping this state, source materials including silicon, carbon, and silicon carbide are eluted from the seed substrate 12 into the silicon melt layer 13. Thus, a concentration gradient is formed in the silicon melt layer 13. As a result, a monocrystalline silicon carbide epitaxially grows on the principal surface 12a of the seed substrate 12, resulting in the formation of a monocrystalline silicon carbide epitaxial growth film 20. The thickness of the silicon melt layer 13 is extremely small and can be, for example, about 10 μm to about 100 μm.

(Seed Substrate 12)

Figure 3:
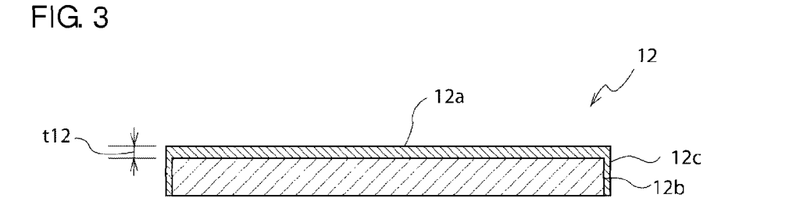
FIG. 3 is a schematic cross-sectional view of a seed substrate in the one embodiment of the present invention.

The seed substrate 12 includes a surface layer containing a polycrystalline silicon carbide with a 3C crystal polymorph. Specifically, in this embodiment, as shown in FIG. 3, the seed substrate 12 includes a graphite-made support member 12b and a polycrystalline silicon carbide film 12c. The graphite-made support member 12b has high thermal resistance so that it can sufficiently withstand the process for epitaxial growth of silicon carbide. Furthermore, the graphite-made support member 12b has a coefficient of thermal expansion similar to that of the monocrystalline silicon carbide epitaxial growth film 20. Therefore, with the use of the graphite-made support member 12b, the silicon carbide epitaxial growth film 20 can be suitably formed.

Specific examples of graphite include natural graphite, artificial graphite, petroleum coke, coal coke, pitch coke, carbon black, and mesocarbon. An example of a method for producing the graphite-made support member 12b is a production method described in JP-A-2005-132711.

The polycrystalline silicon carbide film 12c is formed to cover the principal and side surfaces of the support member 12b. The polycrystalline silicon carbide film 12c contains a polycrystalline silicon carbide. The surface layer of the seed substrate 12 is formed of the polycrystalline silicon carbide film 12c. The polycrystalline silicon carbide film 12c in this embodiment preferably contains polycrystalline 3C—SiC as a major ingredient and is preferably substantially made of polycrystalline 3C—SiC. In other words, in this embodiment, the surface layer of the seed substrate 12 preferably contains polycrystalline 3C—SiC as a major ingredient and is preferably substantially made of polycrystalline 3C—SiC. Thus, the rate of growth of the monocrystalline silicon carbide epitaxial growth film 20 can be increased.

The thickness t12 of the polycrystalline silicon carbide film 12c is preferably within a range of 30 μm to 800 μm, more preferably within a range of 40 μm to 600 μm, and still more preferably within a range of 100 μm to 300 μm. If the thickness t12 of the polycrystalline silicon carbide film 12c is too small, the graphite-made support member 12b may be exposed during the formation of a monocrystalline silicon carbide epitaxial growth film 20, thus causing elution from the support member 12b and resulting in failure to obtain a suitable monocrystalline silicon carbide epitaxial growth film 20. On the other hand, if the thickness t12 of the polycrystalline silicon carbide film 12c is too large, the polycrystalline silicon carbide film 12c may be likely to produce cracks.

No particular limitation is placed on the method for forming the polycrystalline silicon carbide film 12c. The polycrystalline silicon carbide film 12c can be formed, for example, by CVD (chemical vapor deposition) or sputtering. Particularly in this embodiment, since the polycrystalline silicon carbide film 12c contains polycrystalline 3C—SiC, a dense polycrystalline silicon carbide film 12c can be formed with ease at low cost by CVD.

In this embodiment, when the polycrystalline silicon carbide film 12c forming the surface layer of the seed substrate is subjected to Raman spectroscopic analysis with an excitation wavelength of 532 nm, not only a TO peak and an LO peak but also a peak other than the TO peak and the LO peak are observed as peaks derived from a polycrystalline silicon carbide with a 3C crystal polymorph. Therefore, the polycrystalline silicon carbide film 12c is less likely to cause the elution into the silicon melt layer 13. Thus, with the use of the seed substrate 12 of this embodiment, a concentration gradient in the silicon melt layer 13 can be suitably formed, so that liquid phase epitaxial growth of silicon carbide can be suitably performed.

Furthermore, the polycrystalline silicon carbide film 12c forming the surface layer of the seed substrate 12 contains a polycrystalline silicon carbide with a 3C crystal polymorph. Therefore, unlike the case where the surface layer contains a polycrystalline silicon carbide with a 4H or 6H crystal polymorph and the case where the surface layer is made of a monocrystalline silicon carbide, the polycrystalline silicon carbide film 12c can be formed with ease at low cost by CVD (chemical vapor deposition).

Hence, with the use of the seed substrate 12, an epitaxial growth film of a monocrystalline silicon carbide can be formed with ease at low cost.

Moreover, since a peak other than a TO peak and an LO peak is observed as a peak derived from a polycrystalline silicon carbide with a 3C crystal polymorph upon Raman spectroscopic analysis of the polycrystalline silicon carbide film 12c, a hexagonal monocrystalline silicon carbide epitaxial growth film can be suitably formed.

In this relation, the peak other than a TO peak and an LO peak can be considered as a peak derived from structural defects of 3C (the cubic crystal). Therefore, if a peak other than a TO peak and an LO peak is observed, the 3C crystal structure can be considered to have structural defects.

For example, if the 3C crystal structure has no structural defect, it can be considered that when a monocrystalline silicon carbide is epitaxially grown on the polycrystalline silicon carbide film 12c, the crystal structure of the surface of the polycrystalline silicon carbide film 12c is highly likely to be introduced into the monocrystalline silicon carbide, which makes it likely that a monocrystalline silicon carbide epitaxial growth film 20 with a 3C crystal structure is formed.

In contrast, if the 3C crystal structure has structural defects as in this embodiment, it can be considered that the polycrystalline silicon carbide film 12c generates a portion of the surface transitioning in crystal structure to hexagonal and the portion nucleates epitaxial growth, so that a monocrystalline silicon carbide epitaxial growth film 20 with a hexagonal crystal structure is suitably formed.

In view of this, the higher the peak intensity of the peak other than the TO peak and the LO peak, the better. Specifically, the peak other than the TO peak and the LO peak preferably has a peak intensity 0.3 or greater times the peak intensity of the TO peak.

Typical examples of the hexagonal monocrystalline silicon carbide include a monocrystalline silicon carbide with a 4H crystal polymorph and a monocrystalline silicon carbide with a 6H crystal polymorph. These monocrystalline silicon carbides with a 4H or 6H crystal polymorph (4H—SiC and 6H—SiC) have the advantage of enabling semiconductor devices having a larger band gap and higher thermal resistance than other silicon carbides with different crystal polymorphs.

Although no particular limitation is placed on the position where the peak other than a TO peak and an LO peak is to be observed, the peak other than a TO peak and an LO peak is preferably observed at a lower wavenumber than that of the TO peak.

Preferably, the absolute amount of shift of the LO peak from 972 $cm^{-1}$ is preferably 4 $cm^{-1}$ or more, and more preferably, the amount of shift of the LO peak from 972 $cm^{-1}$ is 4 $cm^{-1}$ or more. In this case, the rate of epitaxial growth of the monocrystalline silicon carbide epitaxial growth film 20 can be increased.

Furthermore, the full width at half-maximum of the LO peak is preferably 15 $cm^{-1}$ or less. In this case, the rate of epitaxial growth of the monocrystalline silicon carbide can be still further increased.

The reason why the rate of epitaxial growth of the monocrystalline silicon carbide can be further increased when the full width at half-maximum of the LO peak is 15 cm$^{-1}$ or less can be that smaller full widths at half-maximum of the LO peak can be caused by higher degrees of crystallinity or lower impurity concentrations of the polycrystalline silicon carbide in the surface layer of the seed substrate 12, which makes it still less likely to cause the elution from the surface layer of the seed substrate 12.

(Feed Substrate 11)

In this embodiment, no particular limitation is placed on the material of the feed substrate 11 so long as it is less likely to cause the elution into the silicon melt layer 13 than the seed substrate 12. Therefore, an example of the feed substrate 11 that can be suitably used is a substrate which includes a surface layer containing a polycrystalline silicon carbide with a 3C crystal polymorph and in which upon Raman spectroscopic analysis of the surface layer with an excitation wavelength of 532 nm substantially only an LO peak and a TO peak are observed as peaks derived from the polycrystalline silicon carbide with a 3C crystal polymorph and the absolute amount of shift of the LO peak from 972 cm$^{-1}$ is less than 4 cm$^{-1}$.

Figure 2:
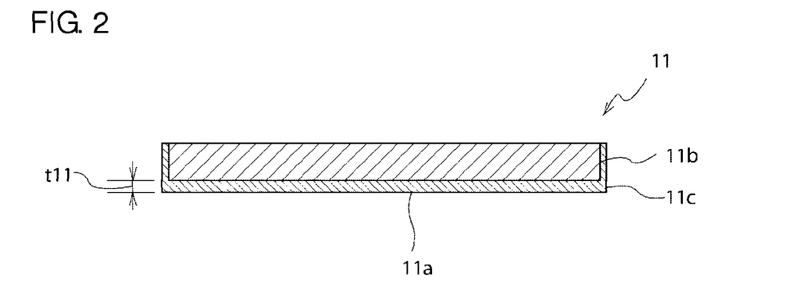
FIG. 2 is a schematic cross-sectional view of a feed substrate in the one embodiment of the present invention.

FIG. 2 shows a schematic cross-sectional view of the feed substrate 11 in this embodiment. Specifically, in this embodiment, as shown in FIG. 2, the feed substrate 11 includes a graphite-made support member 11b and a polycrystalline silicon carbide film 11c. The graphite-made support member 11b has high thermal resistance so that it can sufficiently withstand the process for epitaxial growth of silicon carbide. Furthermore, the graphite-made support member 11b has a coefficient of thermal expansion similar to that of the monocrystalline silicon carbide epitaxial growth film 20. Therefore, with the use of the graphite-made support member 11b, the silicon carbide epitaxial growth film 20 can be suitably formed.

Specific examples of graphite include natural graphite, artificial graphite, petroleum coke, coal coke, pitch coke, carbon black, and mesocarbon. An example of a method for producing the graphite-made support member 11b is a production method described in JP-A-2005-132711.

The polycrystalline silicon carbide film 11c is formed to cover the principal and side surfaces of the support member 11b. The polycrystalline silicon carbide film 11c contains a polycrystalline silicon carbide. The surface layer of the feed substrate 11 is formed of the polycrystalline silicon carbide film 11c. The polycrystalline silicon carbide film 11c preferably contains polycrystalline 3C—SiC as a major ingredient and is preferably substantially made of polycrystalline 3C—SiC. In other words, the surface layer of the feed substrate 11 preferably contains polycrystalline 3C—SiC as a major ingredient and is preferably substantially made of polycrystalline 3C—SiC. Thus, the rate of growth of the monocrystalline silicon carbide epitaxial growth film 20 can be increased.

The thickness t11 of the polycrystalline silicon carbide film 11c is preferably within a range of 30 μm to 800 μm, more preferably within a range of 40 μm to 600 μm, and still more preferably within a range of 100 μm to 300 μm. If the thickness t11 of the polycrystalline silicon carbide film 11c is too small, the graphite-made support member 11b may be exposed during the formation of a monocrystalline silicon carbide epitaxial growth film 20, thus causing elution from the support member 11b and resulting in failure to obtain a suitable monocrystalline silicon carbide epitaxial growth film 20. On the other hand, if the thickness t11 of the polycrystalline silicon carbide film 11c is too large, the polycrystalline silicon carbide film 11c may be likely to produce cracks.

No particular limitation is placed on the method for forming the polycrystalline silicon carbide film 11c. The polycrystalline silicon carbide film 11c can be formed, for example, by CVD (chemical vapor deposition) or sputtering. Particularly in this embodiment, since the polycrystalline silicon carbide film 11c contains polycrystalline 3C—SiC, a dense polycrystalline silicon carbide film 11c can be formed with ease at low cost by CVD.

The polycrystalline silicon carbide film 11c forming the surface layer of the feed substrate 11 contains a polycrystalline silicon carbide with a 3C crystal polymorph and is such that upon Raman spectroscopic analysis with an excitation wavelength of 532 nm substantially only an LO peak and a TO peak are observed as peaks derived from the polycrystalline silicon carbide with a 3C crystal polymorph and the absolute amount of shift of the LO peak from 972 cm$^{-1}$ is less than 4 cm$^{-1}$. Therefore, in this embodiment, the monocrystalline silicon carbide epitaxial growth film 20 can be formed at a high rate of growth.

Figure 4:
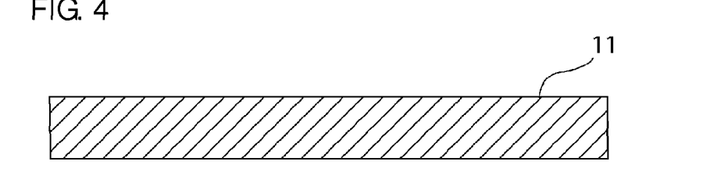
FIG. 4 is a schematic cross-sectional view of a feed substrate in a modification.
Figure 5:
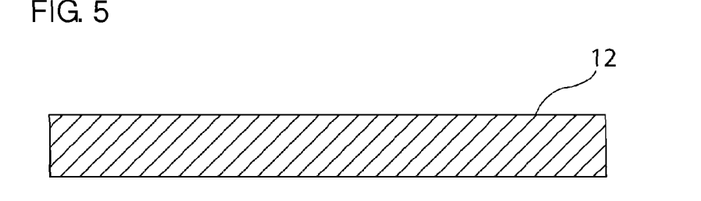
FIG. 5 is a schematic cross-sectional view of a seed substrate in the modification.

The above embodiment has described an example in which each of the feed substrate 11 and the seed substrate 12 is formed of a support member 11b or 12b and a polycrystalline silicon carbide film 11c or 12c. However, the present invention is not limited to the above structure. For example, as shown in FIG. 4, the feed substrate 11 may be formed of a silicon carbide substrate containing silicon carbide. Furthermore, as shown in FIG. 5, the seed substrate 12 may be formed of a polycrystalline silicon substrate containing a polycrystalline silicon carbide with a 3C crystal polymorph.

The silicon carbide substrate can be produced, for example, by coating a graphite base material with a polycrystalline silicon carbide by CDV and then mechanically or chemically removing graphite. Alternatively, the silicon carbide substrate can be produced by reacting a graphite material with silicate gas to convert the graphite material into silicon carbide. Still alternatively, the silicon carbide substrate can be produced by adding a sintering aid to silicon carbide powder and sintering the silicon carbide powder at a high temperature of 1600° C. or above.

The present invention will be further described below with reference to specific examples, but is not at all limited by the following specific examples.

Production Example 1

A graphite material (15 mm by 15 mm by 2 mm) made of high-purity isotropic graphite having a bulk density of 1.85 g/cm$^3$ and an ash content of 5 ppm or less was used as a base material. The base material was put into a CVD reactor and a 30 μm thick polycrystalline silicon carbide coating was formed on the base material by CVD to produce Sample 1. Silicon tetrachloride and propane gas were used as source gases. The deposition was performed at an ordinary pressure and 1200° C. The deposition rate was at 30 μm/h.

Production Example 2

A 50 μm thick polycrystalline silicon carbide coating was formed on the surface of a graphite material in the same manner as in Production Example 1 above except that the reaction temperature was at 1400° C. and the deposition rate was at 60 μm/h, resulting in the production of Sample 2.

Production Example 3

A 50 μm thick polycrystalline silicon carbide coating was formed on the surface of a graphite material in the same manner as in Production Example 1 above except that the reaction temperature was at 1250° C., the deposition rate was at 10 μm/h, and CH₃SiCl₃ was used instead of silicon tetrachloride, resulting in the production of Sample 3.

Production Example 4

A 50 μm thick polycrystalline silicon carbide coating was formed on the surface of a graphite material in the same manner as in Production Example 1 above except that dichlorosilane (SiH₂Cl₂) and acetylene were used instead of silicon tetrachloride and propane gas, the reaction temperature was at 1300° C., and the deposition rate was at 10 μm/h, resulting in the production of Sample 4. In Sample 4, the thickness of the polycrystalline silicon carbide coating was approximately 1 mm.

(Raman Spectroscopic Analysis)

The surface layers of the above produced Samples 1 to 4 were subjected to Raman spectroscopic analysis. An excitation wavelength of 532 nm was used for the Raman spectroscopic analysis. The measurement results are shown in FIG. 6.

Figure 6:
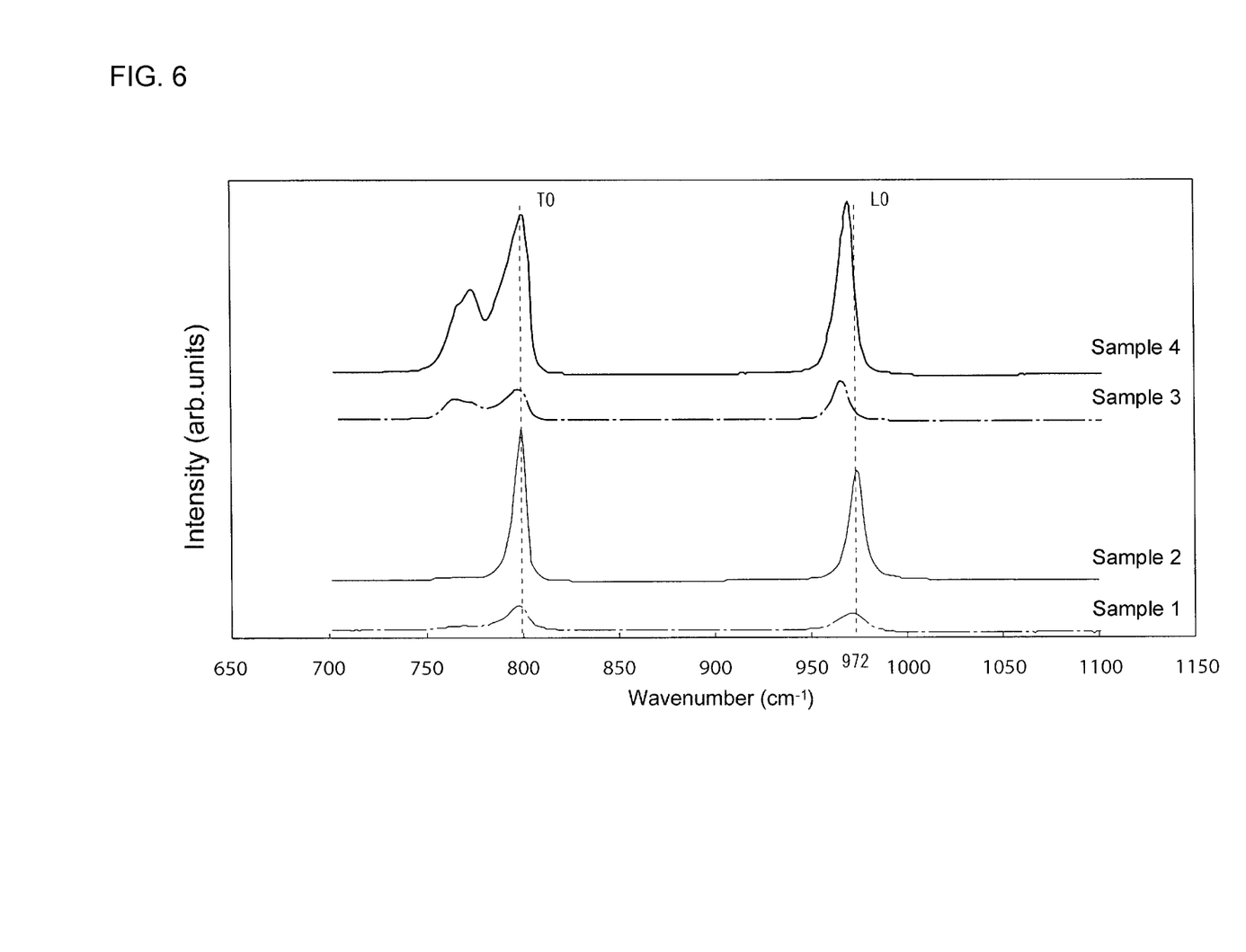
FIG. 6 is a graph showing the results of Raman spectroscopic analysis of the surface layers of Samples 1 to 4.

As shown in FIG. 6, in Samples 1 and 2, substantially only an LO peak and a TO peak were observed as peaks derived from a polycrystalline silicon carbide with a 3C crystal polymorph. On the other hand, in Samples 3 and 4, not only an LO peak and a TO peak but also an additional peak located at a lower wavenumber than that of the TO peak were observed as peaks derived from a polycrystalline silicon carbide with a 3C crystal polymorph. In Sample 3, the additional peak has a peak intensity 0.97 times the peak intensity of the TO peak. In Sample 4, the additional peak has a peak intensity 0.82 times the peak intensity of the TO peak.

Next, from the measurement results shown in FIG. 6, the amounts ($\Delta\omega$) of shift of LO peaks from 972 cm$^{-1}$ in Samples 1 to 4 and full widths at half-maximum (FWHM) of the LO peaks were determined. The results are shown in FIG. 7.

Figure 7:
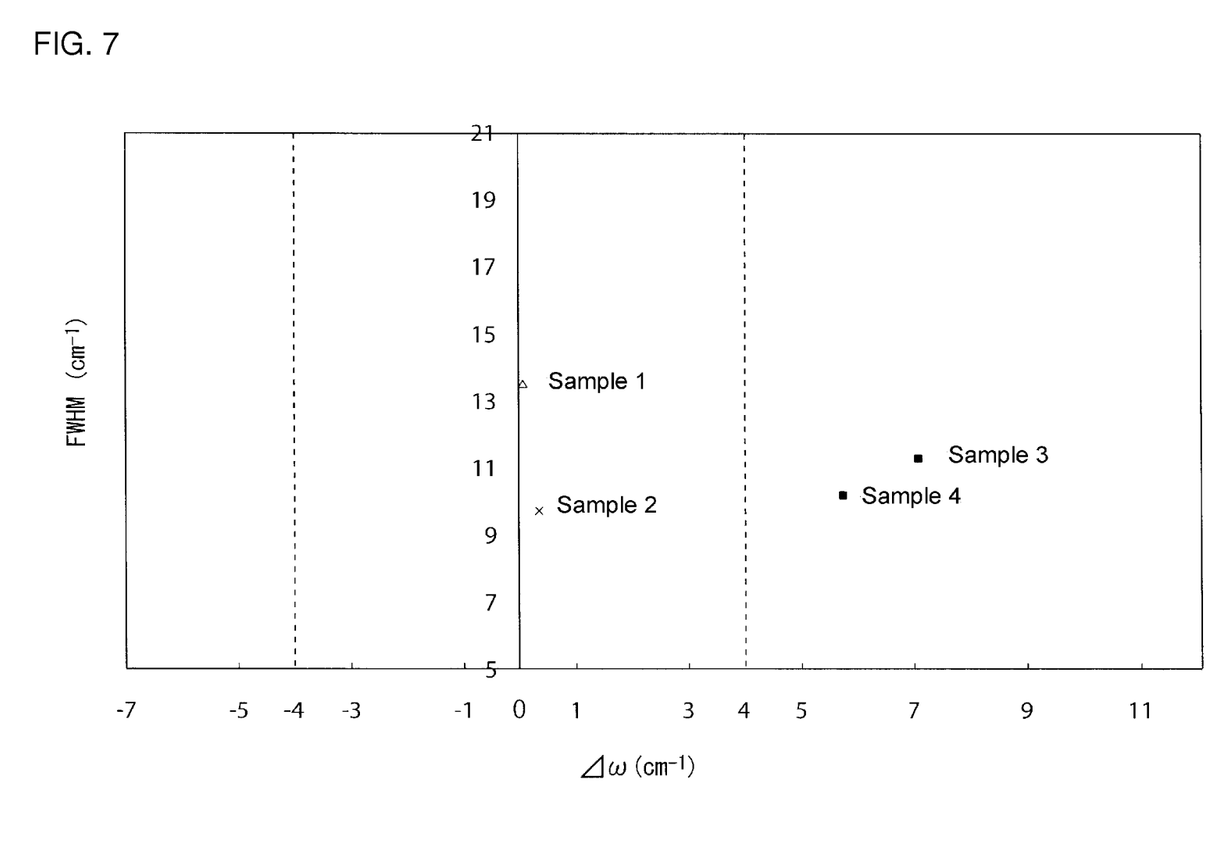
FIG. 7 is a graph showing the amounts ($\Delta\omega$) of shift of LO peaks from 972 cm$^{-1}$ in Samples 1 to 4 and the full widths at half-maximum (FWHM) of the LO peaks.

As shown in FIG. 7, Samples 3 and 4 each had an absolute value of $\Delta\omega$ of more than 4 cm$^{-1}$ and an FWHM of more than 7 cm$^{-1}$. On the other hand, Samples 1 and 2 each had an FWHM of more than 7 cm$^{-1}$ like Samples 3 and 4, but their absolute values of $\Delta\omega$ were less than 4 cm$^{-1}$.

(Evaluation of Rate of Growth of Monocrystalline Silicon Carbide Liquid Phase Epitaxial Growth Film)

Using Samples 1 to 4 as feed substrates, respective monocrystalline silicon carbide epitaxial growth films 20 were produced under the conditions shown below by the method for liquid phase epitaxial growth described in the above embodiment. Then, the thickness of each of the silicon carbide epitaxial growth films 20 was measured by observing the cross section of the silicon carbide epitaxial growth film 20 with an optical microscope. The rate of growth of each monocrystalline silicon carbide epitaxial growth film 20 was determined by dividing the measured thickness by the time for epitaxial growth of silicon carbide.

Figure 8:
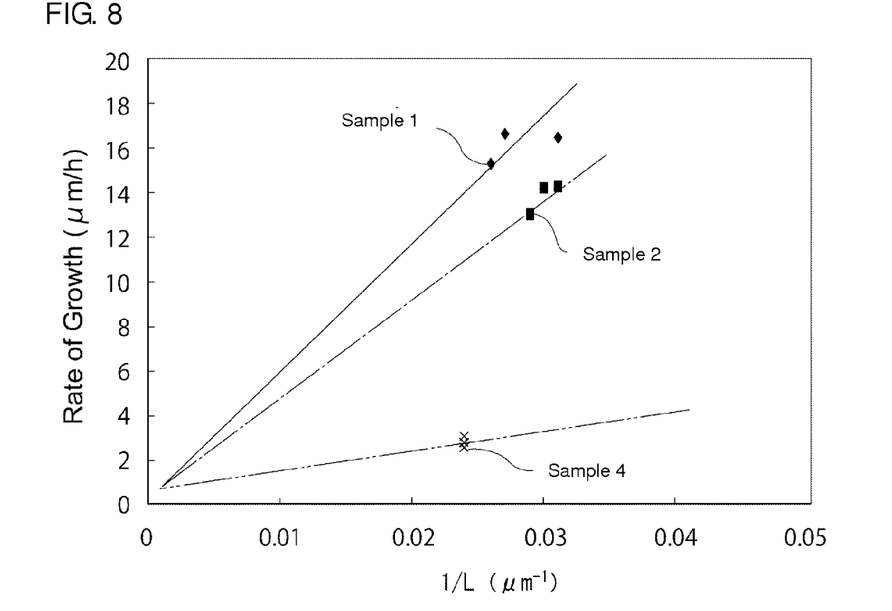
FIG. 8 is a graph showing the rates of growth of monocrystalline silicon carbide epitaxial growth films in Samples 1, 2, and 4.
Figure 9:
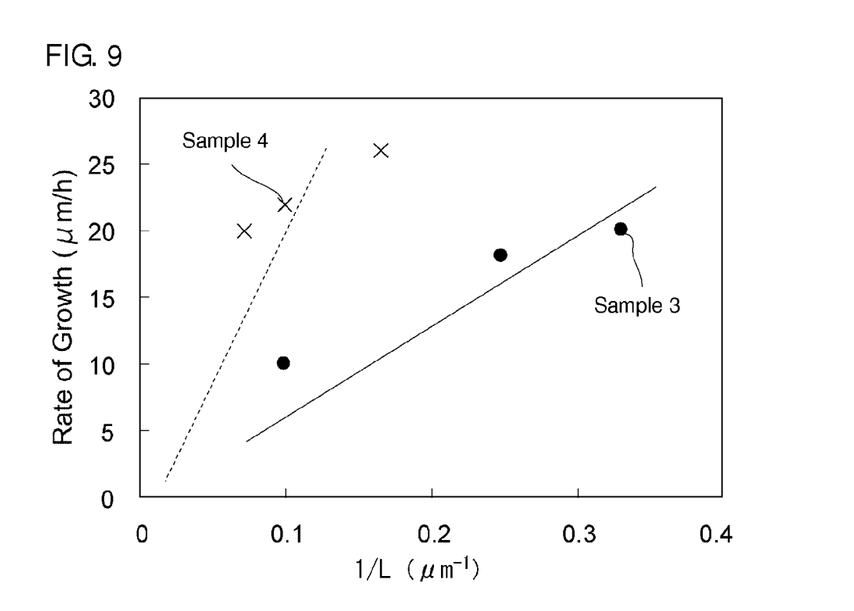
FIG. 9 is a graph showing the rates of growth of monocrystalline silicon carbide epitaxial growth films in Samples 3 and 4.

The results are shown in FIGS. 8 and 9. In FIGS. 8 and 9, the ordinate represents the rate of growth of each monocrystalline silicon carbide epitaxial growth film 20 and the abscissa represents the reciprocal (1/L) of the thickness (L) of the silicon melt layer 13.

As seen from the results shown in FIGS. 8 and 9, in the case of using Samples 3 and 4 in which a peak other than an LO peak and a TO peak was observed, the rate of growth of the monocrystalline silicon carbide epitaxial growth film 20 was low. On the other hand, in the case of using Samples 1 and 2 in which substantially no peak other than an LO peak and a TO peak was observed, the rate of growth of the monocrystalline silicon carbide epitaxial growth film 20 was high. These results show that in the case where a peak other than an LO peak and a TO peak is observed, the elution into the silicon melt layer is less likely to occur.

(Measurement Conditions of Rate of Growth of Monocrystalline Silicon Carbide Epitaxial Growth Film 20)

Seed substrate: a silicon carbide substrate with a 4H crystal polymorph,

Pressure of Atmosphere: $10^{-6}$ to $10^{-4}$ Pa, and

Temperature of Atmosphere: 1900° C.

Example

Figure 10:
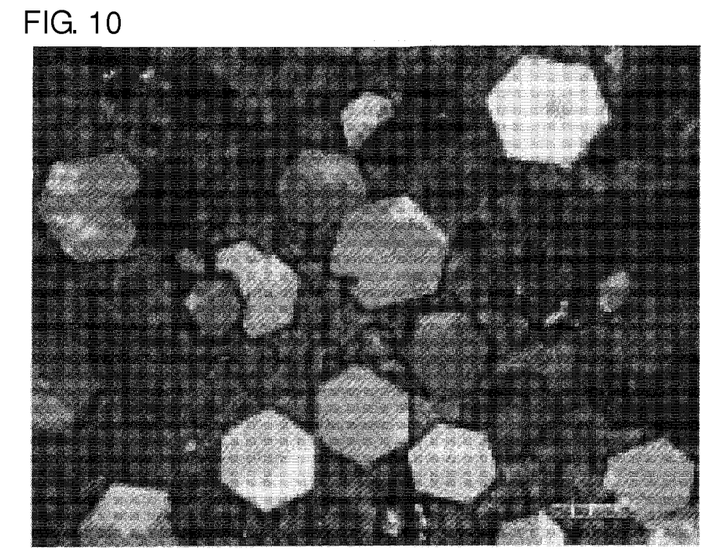
FIG. 10 is a SEM photograph of a seed substrate (Sample 3) after being subjected to an experiment of liquid phase epitaxial growth in an example.

Using the above produced Sample 1 as the feed substrate 11 and the above produced Sample 3 as the seed substrate 12, an experiment of liquid phase epitaxial growth of a monocrystalline silicon carbide was conducted under the same conditions as in the above experiment for evaluation of rate of growth. Thereafter, a photograph of the surface of Sample 3 serving as the seed substrate 12 was taken with a scanning electron microscope (SEM). The SEM photograph of the surface of Sample 3 is shown in FIG. 10. The photograph shown in FIG. 10 reveals that by using as the seed substrate 12 Sample 3 in which a peak other than an LO peak and a TO peak is observed as a peak derived from a polycrystalline silicon carbide with a 3C crystal polymorph, a hexagonal monocrystalline silicon carbide epitaxial growth film can be obtained.

Comparative Example

Figure 11:
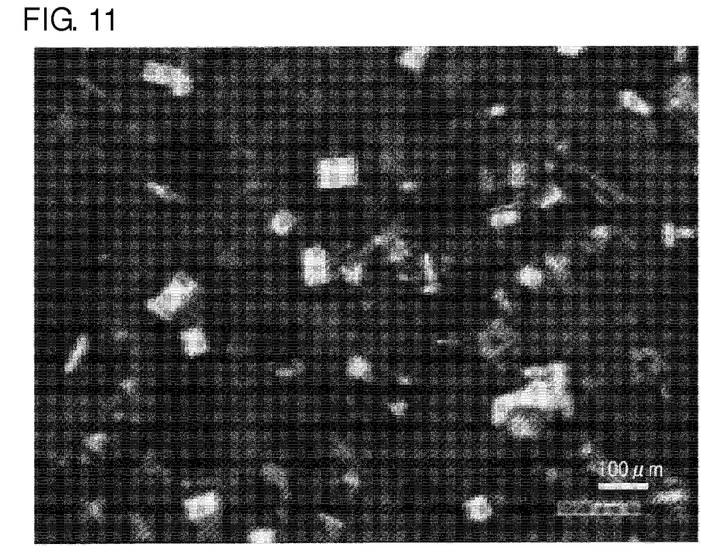
FIG. 11 is a SEM photograph of a seed substrate (Sample 2) after being subjected to an experiment of liquid phase epitaxial growth in a comparative example.

Using the above produced Sample 1 as a feed substrate and the above produced Sample 2 as a seed substrate, an experiment of liquid phase epitaxial growth of a monocrystalline silicon carbide was conducted under the same conditions as in the above experiment for evaluation of rate of growth. Thereafter, a photograph of the surface of Sample 2 serving as the seed substrate was taken with a scanning electron microscope (SEM). The SEM photograph of the surface of Sample 2 is shown in FIG. 11. The photograph shown in FIG. 11 reveals that in the case of using as a seed substrate Sample 2 in which substantially no peak other than an LO peak and a TO peak is observed as a peak derived from a polycrystalline silicon carbide with a 3C crystal polymorph, epitaxial growth hardly progresses and no suitable hexagonal monocrystalline silicon carbide epitaxial growth film can be obtained.

REFERENCE SIGNS LIST

10 . . . vessel
11 . . . feed substrate
11a . . . principal surface
11b . . . support member
11c . . . polycrystalline silicon carbide film
12 . . . seed substrate
12a . . . principal surface
12b . . . support member
12b . . . polycrystalline silicon carbide film
13 . . . silicon melt layer
20 . . . monocrystalline silicon carbide epitaxial growth film

The invention claimed is:

1. A method for liquid phase epitaxial growth of a monocrystalline silicon carbide comprising the steps of:
preparing a seed material and a feed material, the seed material including a surface layer containing a polycrystalline silicon carbide with a 3C crystal polymorph, wherein upon Raman spectroscopic analysis of the surface layer with an excitation wavelength of 532 nm, a peak other than a TO peak and an LO peak is observed as a peak derived from the polycrystalline silicon carbide with a 3C crystal polymorph; and
heating the seed material and the feed material with the surface layers of the seed material and the feed material facing each other through a silicon melt layer to epitaxially grow a monocrystalline silicon carbide on the surface layer of the seed material.

2. The method for liquid phase epitaxial growth of a monocrystalline silicon carbide according to claim 1, wherein the peak other than the TO peak and the LO peak is observed at a lower wavenumber than that of the TO peak.

3. The method for liquid phase epitaxial growth of a monocrystalline silicon carbide according to claim 1, wherein the peak other than the TO peak and the LO peak has a peak intensity 0.3 or greater times the peak intensity of the TO peak.

4. The method for liquid phase epitaxial growth of a monocrystalline silicon carbide according to claim 1, wherein the absolute amount of shift of the LO peak from 972 $cm^{-1}$ is 4 $cm^{-1}$ or more.

5. The method for liquid phase epitaxial growth of a monocrystalline silicon carbide according to claim 4, wherein the amount of shift of the LO peak from 972 $cm^{-1}$ is 4 $cm^{-1}$ or more.

6. The method for liquid phase epitaxial growth of a monocrystalline silicon carbide according to claim 1, wherein the full width at half-maximum of the LO peak is 15 $cm^{-1}$ or less.

7. The method for liquid phase epitaxial growth of a monocrystalline silicon carbide according to claim 1, wherein the surface layer contains a polycrystalline silicon carbide with a 3C crystal polymorph as a major ingredient.

8. The method for liquid phase epitaxial growth of a monocrystalline silicon carbide according to claim 7, wherein the surface layer is substantially made of the polycrystalline silicon carbide with a 3C crystal polymorph.

9. The method for liquid phase epitaxial growth of a monocrystalline silicon carbide according to claim 1, wherein the seed material including: a support member; and a polycrystalline silicon carbide film formed on the support member and forming the surface layer.

10. The method for liquid phase epitaxial growth of a monocrystalline silicon carbide according to claim 9, wherein the polycrystalline silicon carbide film has a thickness within a range of 30 μm to 800 μm.

11. The method for liquid phase epitaxial growth of a monocrystalline silicon carbide according to claim 1, wherein the seed material being formed of a polycrystalline silicon carbide material containing a polycrystalline silicon carbide with a 3C crystal polymorph.

12. The method for liquid phase epitaxial growth of a monocrystalline silicon carbide according to claim 1, wherein the surface layer of the feed material contains a polycrystalline silicon carbide with a 3C crystal polymorph.

* * * * *